(12) United States Patent
Kanesato et al.

(10) Patent No.: US 8,222,335 B2
(45) Date of Patent: Jul. 17, 2012

(54) FLUORESCENT RESIN COMPOSITION AND SOLAR BATTERY MODULE USING THE SAME

(75) Inventors: Masatoshi Kanesato, Ibaraki (JP); Kenta Sugaya, Ibaraki (JP); Masashi Segawa, Tokyo (JP)

(73) Assignee: Sanvic Inc., Tokyo (JP)

( * ) Notice: Subject to any disclaimer, the term of this patent is extended or adjusted under 35 U.S.C. 154(b) by 518 days.

(21) Appl. No.: 12/311,889

(22) PCT Filed: Oct. 18, 2006

(86) PCT No.: PCT/JP2006/320762
§ 371 (c)(1),
(2), (4) Date: Apr. 17, 2009

(87) PCT Pub. No.: WO2008/047427
PCT Pub. Date: Apr. 24, 2008

(65) Prior Publication Data
US 2010/0294366 A1    Nov. 25, 2010

(51) Int. Cl.
C08K 5/04 (2006.01)
B32B 9/00 (2006.01)
(52) U.S. Cl. ............ 524/398; 428/690
(58) Field of Classification Search ............ 524/399, 524/398; 428/690
See application file for complete search history.

(56) References Cited

U.S. PATENT DOCUMENTS
2004/0018382 A1 * 1/2004 Kinlen ............... 428/690

FOREIGN PATENT DOCUMENTS
| | | |
|---|---|---|
| CN | 1350050 | 5/2002 |
| JP | 06-177412 | 6/1994 |
| JP | 07-202243 | 8/1995 |
| JP | 08-102257 | 4/1996 |
| JP | 2001-308365 | 11/2001 |
| JP | 2002-222974 | 8/2002 |
| JP | 2004-249644 | 9/2004 |
| JP | 2005-044930 | * 2/2005 |
| JP | 2005-44930 | 2/2005 |
| WO | 02/087308 | 11/2002 |
| WO | 2004/052979 | 6/2004 |

OTHER PUBLICATIONS

Supplementary European Search Report dated Aug. 31, 2009 in European Application No. EP 06 81 1958.
Chinese Office Action No. 200680056064.7 issued Apr. 13, 2010 and partial English translation thereof.

* cited by examiner

*Primary Examiner* — Ling Choi
(74) *Attorney, Agent, or Firm* — Wenderoth, Lind & Ponack, L.L.P.

(57) ABSTRACT

This invention provides an organic rare earth metal complex, which emits fluorescence with a wavelength in the range of 550 to 900 nm, particularly a fluorescent resin composition comprising an ethylene-vinyl acetate copolymer containing 0.01 to 10% by mass of an organic rare earth metal complex represented by general formula

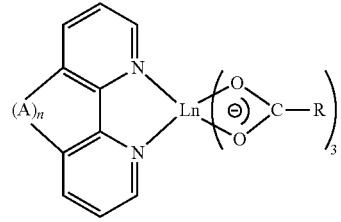

wherein R represents an aliphatic or aromatic hydrocarbon group; Ln represents a rare earth metal; A represents group —CH═CH—; and n is 0 or 1. There are also provided a solar battery module using the fluorescent resin composition as a sealing material between a front cover and a crystalline silicon cell, and a solar battery with high conversion efficiency.

6 Claims, 1 Drawing Sheet

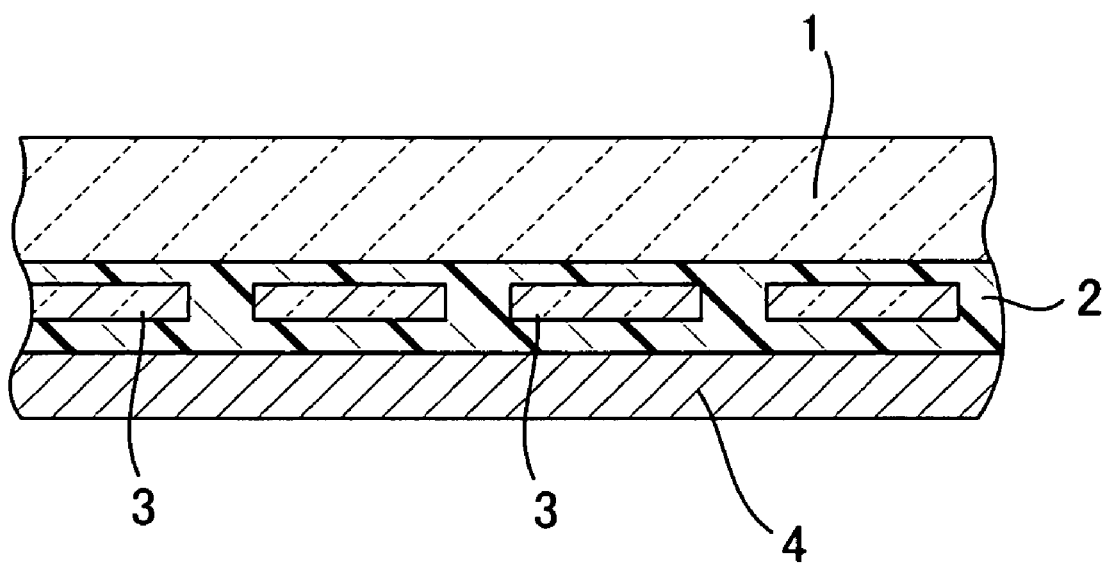

FLUORESCENT RESIN COMPOSITION AND SOLAR BATTERY MODULE USING THE SAME

This application is a U.S. National Stage of International Application No. PCT/JP2006/320762, filed Oct. 18, 2006.

TECHNICAL FIELD

The present invention relates to a novel fluorescent resin composition suitable as a solar cell or battery module-sealing material and a solar cell module using the same.

BACKGROUND ART

A solar cell that converts sun light directly into electrical energy has been attracting attention as a means of supplying clean and inexhaustible energy and has been studied in various fields.

Generally, the performance of a solar cell is evaluated by conversion efficiency that is a percentage of electrical energy converted from incident light energy of the sun. The incident light energy is light energy that has been absorbed into a cell (photovoltaic element) inside a solar cell, and thus the conversion efficiency depends on the ability (absorption ability) of a cell to absorb light energy incident on the cell, and the absorption ability varies significantly depending on the performance of the cell used.

For example, sun light has a broad wavelength range including ultraviolet light, visible light and infrared light, but not all these lights upon incident on a solar cell are converted into electrical energy, and only light in the wavelength range which can be adsorbed by the cell can be converted. Light in the wavelength range adsorbed by a cell is determined by physical properties inherent in the cell, where the peak wavelength in spectral irradiance distribution of sun light is in the vicinity of 500 nm, while when a crystalline silicon cell is used, the peak wavelength of spectral sensitivity thereof is in the range of 600 to 1000 nm, and thus sun light cannot be sufficiently adsorbed and the efficiency of conversion of sun light into electrical energy is inevitably lowered. Accordingly, it is an important task for the solar cell to improve conversion efficiency by absorbing as much sun light as possible.

A solar cell using a crystalline silicon cell is known which includes a module structured such that a front cover is arranged at the side of a light-receiving surface and a back cover at the other side, and a crystalline silicon cell is sealed with a sealing material between the covers (JP 6-177412 A). A fluorescent film-forming ink composition is proposed in which an inorganic fluorescent material and an ethylene-vinyl acetate copolymer (hereinafter abbreviated as EVA) have been dissolved in a solvent (JP 8-102257 A), and a composite panel is proposed in which EVA has been compounded with a luminescent pigment and an inorganic light-accumulating fluorescent material (JP 2004-249644 A), but as a solar cell module-sealing material, there is not known a combination of a fluorescent material and EVA.

In these fluorescent materials, however, when a rare earth metal inorganic material is used as a fluorescent substance, the transparency of EVA is significantly inhibited, while when an organic material is used as a fluorescent substance, thermal deterioration is significant with insufficient durability, and thus the combination of the fluorescent substance and EVA has been disadvantageous and practically problematic.

DISCLOSURE OF THE INVENTION

The present invention was completed for the purpose of providing a europium complex-containing fluorescent resin composition preferable as a solar cell module-sealing material, which exhibits excellent durability to ultraviolet light etc. without deteriorating the transparency of EVA.

The present inventors have made extensive studies on a sealing material for a solar cell module, and as a result, found that when an EVA-based resin composition obtained by compounding an EVA-based resin composition, which has conventionally been used to merely fulfill a role as a sealing binder, with a europium complex emitting fluorescence with a wavelength in the range of 550 to 900 nm is used as a sealing material for a crystalline silicon cell, the sealing material absorbs sun light with a wavelength in the range of 500 nm or less and emits fluorescent light with a wavelength in the range of 550 to 900 nm, which light is to be adsorbed by the crystalline silicon cell, thereby achieving a solar cell module having high conversion efficiency and being excellent in transparency and durability. On the basis of this finding, the present invention has been achieved.

That is, the present invention provides a fluorescent resin composition comprising EVA containing 0.01 to 10% by mass of a europium complex expressed by the formula

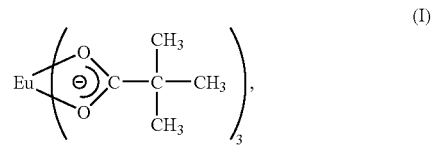

(I)

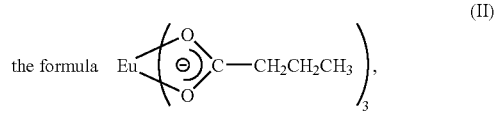

the formula (II)

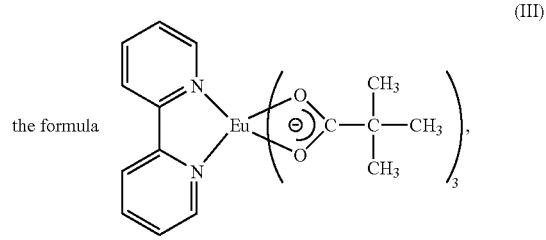

the formula (III)

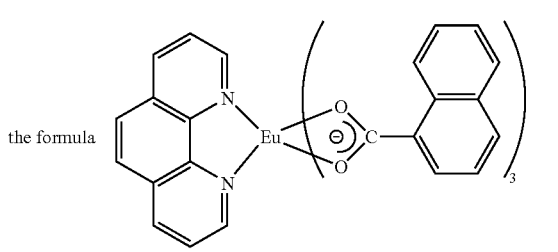

the formula (IV)

or the formula (V)

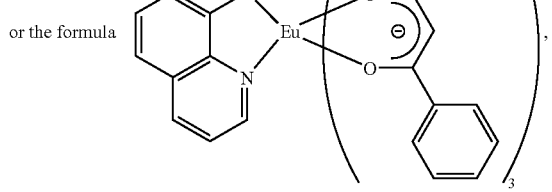

as well as a solar cell module having a structure comprising a front cover, a back cover and a number of units each having a crystalline silicon cell which are integrated between the covers as sealed with a sealing material, wherein the sealing material between the front cover and the crystalline silicon cell contains the fluorescent resin composition described above.

The fluorescent resin composition of the present invention comprises a specific europium complex and EVA.

The europium complex used in the fluorescent resin composition of the present invention includes the complexes represented by the above-mentioned formulae I to V.

Among these, preferable are the europium complexes represented by the above-mentioned formulae III to V.

These complexes are soluble in an organic solvent and excellent in compatibility with EVA, and can thus be uniformly dispersed in EVA.

The amount of the europium complex used shall be 0.01 to 10% by mass, preferably 0.05 to 1% by mass, based on EVA. When this amount is higher than 10% by mass, the increase in costs due to addition of the europium complex is greater than the increase in fluorescence intensity due to the effect of the europium complex, and high costs may result, while when the amount is less than 0.01% by mass, fluorescence intensity becomes insufficient.

EVA used in the fluorescent resin composition of the present invention is not particularly limited and can be selected from among customarily used EVAs, and the content of its vinyl acetate unit is in the range of 10 to 40% by mass, more preferably 20 to 35% by mass.

When the content of the vinyl acetate unit in EVA is less than 10% by mass, the uniform dispersibility of the europium complex in EVA is deteriorated, and transparency is lowered. When the content is higher than 40% by mass, EVA itself is softened and tends to be poor in practical utility as a sheet.

In the fluorescent resin composition of the present invention, an organic peroxide can be previously added to EVA and thermally decomposed, thereby forming a crosslinked structure of EVA or the EVA composition.

The organic peroxide used herein may be any peroxide as long as it generates a radical at 100° C. or higher, but in consideration of the stability thereof in compounding, an organic peroxide whose half-life-10-hour decomposition temperature is 70° C. or higher is preferable.

Examples of such organic peroxides include, for example, 2,5-dimethylhexane-2,5-dihydroperoxide, 2,5-dimethyl-2,5-di(t-butylperoxy)hexane-3, di-t-butyl peroxide, dicumyl peroxide, 2,5-dimethyl-2,5-di(t-butylperoxy)hexane, α,α'-bis(t-butylperoxyisopropyl)benzene, n-butyl-4,4-bis(t-butylperoxy)butane, 2,2-bis(t-butylperoxy)butane, 1,1-bis(t-butylperoxy)cyclohexane, 1,1-bis(t-butylperoxy) 3,3,5-trimethylcyclohexane, t-butylperoxybenzoate, benzoyl peroxide, etc.

It is sufficient for the amount of the organic peroxide incorporated to be up to 5% by mass based on EVA.

An accelerating crosslinking agent may be added if necessary to the fluorescent resin composition of the present invention to further improve the degree of crosslinking and durability of EVA or the EVA composition.

The accelerating crosslinking agent that can be used includes not only trifunctional accelerating crosslinking agents such as triallyl isocyanurate and triallyl cyanurate but also monofunctional accelerating crosslinking agents such as NK esters.

It is sufficient for the amount of the accelerating crosslinking agent incorporated to be up to 10% by mass based on EVA.

The fluorescent resin composition of the present invention may be compounded if necessary with stabilizers such as hydroquinone, hydroquinone monomethyl ether, p-benzoquinone, methyl hydroquinone, etc. in order to improve stability.

It is sufficient for the amount of the stabilizer incorporated to be up to 5% by mass based on EVA.

An ultraviolet absorber, an antioxidant, a discoloration inhibitor, etc. can be added to the fluorescent resin composition of the present invention.

The ultraviolet absorber that can be used includes, for example, benzophenone-based absorbers such as 2-hydroxy-4-n-octoxybenzophenone and 2-hydroxy-4-methoxy-5-sulfobenzophenone, benzotriazole-based absorbers such as 2-(2'-hydroxy-5-methylphenyl)benzotriazole, and hindered amine-based absorbers such as phenyl salicylate and p-t-butylphenyl salicylate.

The antioxidant that can be used includes amine-based inhibitors, phenol-based inhibitors, bisphenyl-based inhibitors and hindered amine-based inhibitors, for example, di-t-butyl-p-cresol and bis(2,2,6,6-tetramethyl-4-piperazyl)sebacate.

The fluorescent resin composition of the present invention is useful as a fluorescent paint, a luminescent element, a wavelength conversion material, an optical sensor or a fluorescence indicator, and is used particularly preferably as a sealing material for a solar cell module.

When the fluorescent resin composition of the present invention is used as a sealing material for a solar cell module, a silane coupling agent is preferably added to further improve the adhesion between the sealing material and the front cover, the back cover or the crystalline silicon cell.

The silane coupling agent that can be used includes, for example, γ-chloropropyltrimethoxysilane, vinyltrichlorosilane, vinyltriethoxysilane, vinyl-tris(β-methoxyethoxy)silane, γ-methacryloxypropyltrimethoxysilane, β-(3,4-ethoxycyclohexyl)ethyl-trimethoxysilane, γ-glycidoxypropyl-trimethoxysilane, vinyltriacetoxysilane, γ-mercaptopropyltrimethoxysilane, γ-aminopropyltrimethoxysilane, N-β-(aminoethyl)-γ-aminopropyl-trimethoxysilane etc.

It is sufficient for the amount of the silane coupling agent incorporated to be up to 5% by mass based on the whole of the sealing material.

The material of the front cover and back cover used in the solar cell module with the fluorescent resin composition as a sealing material includes glass, polycarbonate, acrylic resin, polyester, poly(vinyl fluoride) and polyethylene fluoride. When these materials are used particularly in the front cover, sun light is preferably not prevented from reaching the crystalline silicon cell. These materials are processed and molded in forms of a plate, sheet and film, depending on their physical properties.

In the solar cell module of the present invention, glass is preferably used in the front cover. As this glass, not only white plate glass usually used in solar cell modules, but also blue float glass, figured glass and the like are used.

The back cover can be laminated with a metal layer and/or a plastic film layer for imparting weatherability, high insulation properties and strength. The metal material used herein is one that can prevent penetration of water vapor from the outside and includes aluminum, stainless steel and tin, among which aluminum is preferable in terms of economic efficiency and weight. A plastic material used in the plastic film layer includes poly(vinylidene chloride), polyester, polyethylene, and fluorine-based plastics.

BRIEF DESCRIPTION OF THE DRAWING

FIG. 1 is a schematic cross-sectional view showing a structure of a solar cell module using a crystalline silicon cell, wherein a front cover 1 is arranged at the side of a light-receiving surface and a back cover 4 at the other side and crystalline silicon cells 3, . . . are sealed with a transparent sealing material 2 between the covers. The back cover 4 has, for example, a structure of 3 layers of (poly)vinyl fluoride/aluminum/poly(vinyl fluoride).

BEST MODE FOR CARRYING OUT THE INVENTION

Then, the best mode for carrying out the invention will be described with reference to the Examples, but the invention is not limited in any way by these examples.

Example 1

Six sheets (thickness: 0.5 mm) with the compositions shown in Table 1 were prepared by using EVA containing 28% by mass of vinyl acetate unit and having a melt index of 7 (trade name: "Evatate KA30", manufactured by Sumitomo Chemical Co., Ltd.), and as europium complexes, the complexes expressed by the above-mentioned formulae I to V (hereinafter, referred to Complex I to Complex V, respectively).

TABLE 1

| Sheet No. | | 1 | 2 | 3 | 4 | 5 | 6 |
|---|---|---|---|---|---|---|---|
| Composition (part by mass) | EVA | 100 | 100 | 100 | 100 | 100 | 100 |
| | Europium oxide | 0.2 | 0 | 0 | 0 | 0 | 0 |
| | Complex I | 0 | 0.2 | 0 | 0 | 0 | 0 |
| | Complex II | 0 | 0 | 0.2 | 0 | 0 | 0 |
| | Complex III | 0 | 0 | 0 | 0.2 | 0 | 0 |
| | Complex IV | 0 | 0 | 0 | 0 | 0.2 | 0 |
| | Complex V | 0 | 0 | 0 | 0 | 0 | 0.2 |

Then, when these sheets were visually observed for their transparency, No. 1 became milky as a whole, while Nos. 2 to 6 were all transparent.

When these sheets were irradiated with ultraviolet light having a wavelength of 254 nm and with ultraviolet light having a wavelength of 365 nm, any of Nos. 1 to 6 emitted red fluorescence, and the sheets Nos. 4 to 6 showed significantly higher fluorescence intensity than the sheets Nos. 2 and 3.

Example 2

100 parts by mass of the same EVA as used in Example 1 were compounded with 2,5-dimethyl-2,5-di(t-butylperoxy)hexane (organic peroxide), γ-methacryloxypropyltrimethoxysilane (silane coupling agent), bis(2,2,6,6-tetramethyl-4-piperazyl)sebacate (antioxidant) and a europium complex respectively in the amounts shown in Table 2, to prepare 3 sheets Nos. 7 to 9 (thickness: 0.5 mm) as sealing materials.

TABLE 2

| | | Sheet No. | | |
|---|---|---|---|---|
| | | 7 | 8 | 9 |
| Composition (part by mass) | EVA | 100 | 100 | 100 |
| | Organic peroxide | 1.5 | 1.5 | 1.5 |
| | Silane coupling agent | 1.0 | 1.0 | 1.0 |
| | Antioxidant | 0.1 | 0.1 | 0.1 |
| | Complex I | 0 | 0.2 | 0 |
| | Complex IV | 0 | 0 | 0.2 |

Then, as shown in FIG. 1, 72 crystalline silicon cells 3, . . . were enclosed with a sealing material 2 consisting of the sheet No. 7, 8 or 9, then sandwiched between a white plate glass 1 of 3 mm in thickness and a back cover 4 with a 3-layer structure of poly(vinyl fluoride) (thickness: 38 μm)/aluminum (thickness: 30 μm)/poly(vinyl fluoride) (thickness: 38 μm), degassed for 3 minutes at 150° C. with a laminator and then pressed for 30 minutes under atmospheric pressure, to produce solar cell modules Nos. 1 to 3.

The solar cell modules Nos. 1 to 3 and silicon cells used therein were measured for conversion efficiency. The results are shown in Table 3.

TABLE 3

| | | Solar cell module | | |
|---|---|---|---|---|
| | | No. 1 | No. 2 | No. 3 |
| | | | Sealant | |
| | | No. 7 | No. 8 | No. 9 |
| Conversion efficiency | Silicon cell | 15.0% | 15.0% | 15.0% |
| | Module | 14.5% | 15.0% | 15.5% |

From this table, it can be seen that the conversion efficiency of the solar cell module was significantly increased by using the sealing material to which the europium complex was added.

INDUSTRIAL APPLICABILITY

The fluorescent resin composition of the present invention is useful as a fluorescent paint, a luminescent element, a wavelength conversion material, an optical sensor, a fluorescence indicator, and a solar cell module-sealing material.

The solar cell module of the present invention makes use, as a sealing material, of the fluorescent resin composition of the present invention which absorbs light with a wavelength in the range of 500 nm or less not absorbable by a crystalline silicon cell and emits fluorescent light with a wavelength in the range of 550 to 900 nm, and can thus be used as a solar cell module of high conversion efficiency.

What is claimed is:

1. A fluorescent resin composition comprising an ethylene-vinyl acetate copolymer containing 0.01 to 10% by mass of a europium complex expressed by the formula

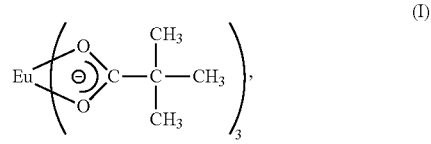  (I)

the formula 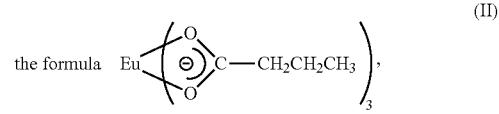  (II)

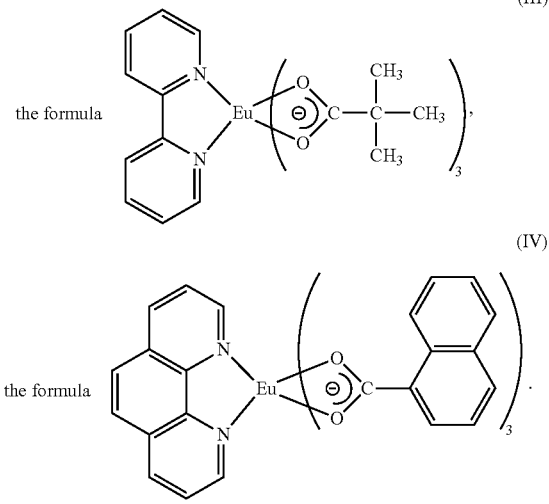

2. The fluorescent resin composition according to claim 1, wherein the ethylene-vinyl acetate copolymer consists of 60 to 90% by mass of the ethylene unit and 10 to 40% by mass of the vinyl acetate unit.

3. A solar cell module having a structure comprising a front cover, a back cover and a number of units each having a crystalline silicon cell which are integrated between the covers as sealed with a sealing material, wherein the sealing material between the front cover and the crystalline silicon cell contains the fluorescent resin composition according to claim 1.

4. The solar cell module according to claim 3, wherein the content of the europium complex in the fluorescent resin composition is 0.05 to 1% by mass.

5. The solar cell module according to claim 3, wherein the content of the ethylene-vinyl acetate copolymer in the sealing material is 50% by mass or more.

6. The solar cell module according to claim 3, wherein the front cover is formed of glass.

* * * * *